(12) United States Patent
Kofuji et al.

(10) Patent No.: US 9,960,014 B2
(45) Date of Patent: May 1, 2018

(54) PLASMA ETCHING METHOD

(71) Applicant: HITACHI HIGH-TECHNOLOGIES CORPORATION, Tokyo (JP)

(72) Inventors: Naoyuki Kofuji, Tama (JP); Ken'etsu Yokogawa, Tsurugashima (JP); Nobuyuki Negishi, Tokyo (JP); Masami Kamibayashi, Kokubunji (JP); Masatoshi Miyake, Kamakura (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days. days.

(21) Appl. No.: 15/370,486

(22) Filed: Dec. 6, 2016

(65) Prior Publication Data

US 2017/0084430 A1    Mar. 23, 2017

Related U.S. Application Data

(62) Division of application No. 13/592,129, filed on Aug. 22, 2012, now abandoned.

(30) Foreign Application Priority Data

Oct. 6, 2011 (JP) .................................. 2011-221688

(51) Int. Cl.
*H01J 37/32* (2006.01)

(52) U.S. Cl.
CPC .. *H01J 37/32165* (2013.01); *H01J 37/32082* (2013.01); *H01J 37/32192* (2013.01); *H01J 37/32302* (2013.01); *H01J 37/32449* (2013.01); *H01J 37/3211* (2013.01); *H01J 2237/006* (2013.01); *H01J 2237/3341* (2013.01)

(58) Field of Classification Search
CPC .......... H01J 37/32165; H01J 37/32082; H01J 37/32192; H01J 37/32302; H01J 37/32449

See application file for complete search history.

(56) References Cited

U.S. PATENT DOCUMENTS

| 5,415,728 A | 5/1995 | Hasegawa et al. |
| 5,498,313 A | 3/1996 | Bailey et al. |
| 5,505,781 A | 4/1996 | Omori et al. |

(Continued)

FOREIGN PATENT DOCUMENTS

| JP | 09-115880 A | 5/1997 |
| JP | 10-064881 A | 3/1998 |
| JP | 2006-517743 A | 7/2006 |

*Primary Examiner* — Duy Vu N Deo
(74) *Attorney, Agent, or Firm* — McDermott Will & Emery LLP

(57) ABSTRACT

In the plasma etching method, a sample is placed on a stage in a chamber. A first gas is introduced into the chamber. Electric field is supplied within the chamber to plasma is generated from the first gas. A first RF power of a first frequency, which is for generating a bias voltage in the sample for etching the sample with radicals which are generated in the plasma while the plasma is generated, is supplied to the stage. A second gas is introduced from a position in outer periphery of a surface of the stage, on which the sample is placed. A second RF power of a second frequency higher than the first frequency and capable of generating plasma from the second gas above the stage that allows radicals generated in the plasma generated from the second gas to be supplied in the outer periphery, is supplied to the stage.

14 Claims, 14 Drawing Sheets

(56) References Cited

U.S. PATENT DOCUMENTS

| | | |
|---|---|---|
| 6,042,687 A | 3/2000 | Singh et al. |
| 6,125,788 A | 10/2000 | Hills et al. |
| 6,263,829 B1 | 7/2001 | Schneider et al. |
| 6,676,760 B2 | 1/2004 | Kholodenko et al. |
| 7,632,356 B2 | 12/2009 | Tomita et al. |
| 7,887,669 B2 | 2/2011 | Satou et al. |
| 2001/0022293 A1 | 9/2001 | Maeda et al. |
| 2002/0014204 A1 | 2/2002 | Pyo |
| 2002/0125213 A1 | 9/2002 | Yamazaki et al. |
| 2004/0155012 A1 | 8/2004 | Rusu et al. |
| 2004/0237894 A1 | 12/2004 | Han et al. |
| 2006/0175015 A1 | 8/2006 | Chen et al. |
| 2006/0196605 A1 | 9/2006 | Ikegami et al. |
| 2007/0193688 A1* | 8/2007 | Dhindsa ............ C23C 16/45521 156/345.43 |
| 2008/0073032 A1 | 3/2008 | Koshiishi et al. |
| 2010/0258529 A1 | 10/2010 | Mori et al. |
| 2015/0262794 A1* | 9/2015 | Kihara ............... H01J 37/32091 216/71 |

* cited by examiner

OUTER PERIPHERAL SIDE OF SPECIMEN          CENTER SIDE OF SPECIMEN

PLASMA ETCHING METHOD

CLAIM OF PRIORITY

The present application is a division of U.S. patent application Ser. No. 13/592,129 filed Aug. 22, 2012, which claims priority from Japanese patent application JP 2011-221688 filed on Oct. 6, 2011, the contents of which are hereby incorporated by reference into this application.

BACKGROUND OF THE INVENTION

Technical Field

The present invention relates to a plasma etching method for use in manufacturing a semiconductor device.

Background Art

The plasma etching apparatus used in processing of a semiconductor device generates ions and radicals by dissociating a reactive gas by plasma within a decompression chamber, and irradiates a surface of a sample with the ions and the radicals to process the sample. It is general to create energy for generating the plasma by electromagnetic waves. From the viewpoint of a method for inputting the electromagnetic wave, the plasma etching apparatus is roughly classified into two systems. One of the systems is an electrode discharge system such as parallel plate plasma or a magnetron RIE in which an antenna electrode for generating the electromagnetic wave is disposed in the decompression chamber. The other system is an electrodeless discharge system such as microwave plasma (for example, Japanese Patent Application Laid-Open Publication No. Hei-10-64881) or an inductively coupled plasma (for example, Japanese Patent Application Laid-Open Publication No. 2006-517743), in which the antenna electrode is disposed outside of the decompression chamber, and the electromagnetic wave is introduced through a dielectric window that separates the decompression chamber from the external. In a process (front end process) of forming a transistor among processes for manufacturing the semiconductor device, in order to prevent a temporal change in discharge characteristics due to the corrosion of the antenna electrode, or the deterioration of the transistor characteristic due to heavy metal released from the corroded antenna electrode, the electrodeless discharge system has been used. The electrodeless discharge system has such a feature that non-uniform plasma is generated on the decompression chamber side of the dielectric window. Accordingly, in order to uniformly etch a sample with a large diameter, there has been used a method in which the sample is sufficiently distanced from the dielectric window, and ions are uniformized by diffusion.

SUMMARY OF THE INVENTION

The recent study has found that the radicals cannot be sufficiently uniformized in the method in which the sample is merely sufficiently distanced from the dielectric window. Under the circumstances, the present inventors have studied the positive effects of improving the uniformity by the technique disclosed in Japanese Patent Application Laid-Open Publication No. Hei-10-64881, that is, by introducing an additive gas whose slight flow rate needs to be controlled into a periphery of the sample.

However, it has been found that even if a gas that is liable to generate desired radicals is added from an outer periphery of the sample as the additive gas, there is substantially no positive effect of improving the uniformity.

An object of the present invention is to provide a plasma etching method of the electrodeless system which can uniformize the radical density to improve the uniformity of etching.

In order to achieve the above object, according to one aspect of the present invention, a plasma etching method is provided. In the plasma etching method, a sample is placed on a stage disposed in a decompression chamber. A first gas is introduced into the decompression chamber. Electric field is supplied within to an upper portion of the decompression chamber from an outside of the decompression chamber and plasma is generated from the first gas inside the decompression chamber. A first RF power of a first frequency, which is capable of generating a bias voltage in the sample for etching the sample with radicals which are generated in the plasma while the plasma is generated, is supplied to the stage. A second gas is introduced from a position in outer periphery of a surface of the stage, on which the sample is placed. A second RF power of a second frequency which is higher than the first frequency and capable of generating plasma from the second gas above the stage that allows radicals generated in the plasma generated from the second gas to be supplied in the outer periphery, is supplied to the stage.

According to the present invention, there can be provided the plasma etching method using the electrodeless system that enables even etching because a reduction in the radicals on the outer periphery of the sample can be compensated.

DETAILED DESCRIPTION OF THE PREFERRED EMBODIMENTS

The present inventors have studied reasons that the uniformity is not improved even if a gas that is liable to generate desired radicals is added from an outer periphery of the sample as an additive gas. As a result, the present inventors have found, for example, the following facts. Because oxygen radicals and carbon radicals are high in extinction probability in the inner wall of the decompression chamber, the radicals in the vicinity of the inner wall of the decompression chamber are extinguished while the radiations are diffused from the plasma generation area in the vicinity of the dielectric window to the sample, and the radical density in the outer peripheral part is reduced in the vicinity of the sample. Because the radical density is decreased, a pattern dimension after processing is thinned in the outer peripheral of the sample. The gas that is liable to generate the radicals introduced from the periphery of the sample dissociates in the plasma generation area which is not in the periphery of the sample, but above the sample and in the vicinity of the dielectric window to generate the radicals. Therefore, the entire radical density within the decompression chamber is increased, but there is no effect of increasing the radical density only in the vicinity of the inner wall of the decompression chamber, and the radical density is not uniformized. In order to increase the radical density only in the vicinity of the inner wall of the decompression chamber to uniformize the radical density, there is a need to form the plasma generation area in the vicinity of the inner wall of a processing chamber, particularly in the periphery of the sample. The present invention has been derived from the above knowledge.

Hereinafter, embodiments will be described in detail.

First Embodiment

Figure 1:
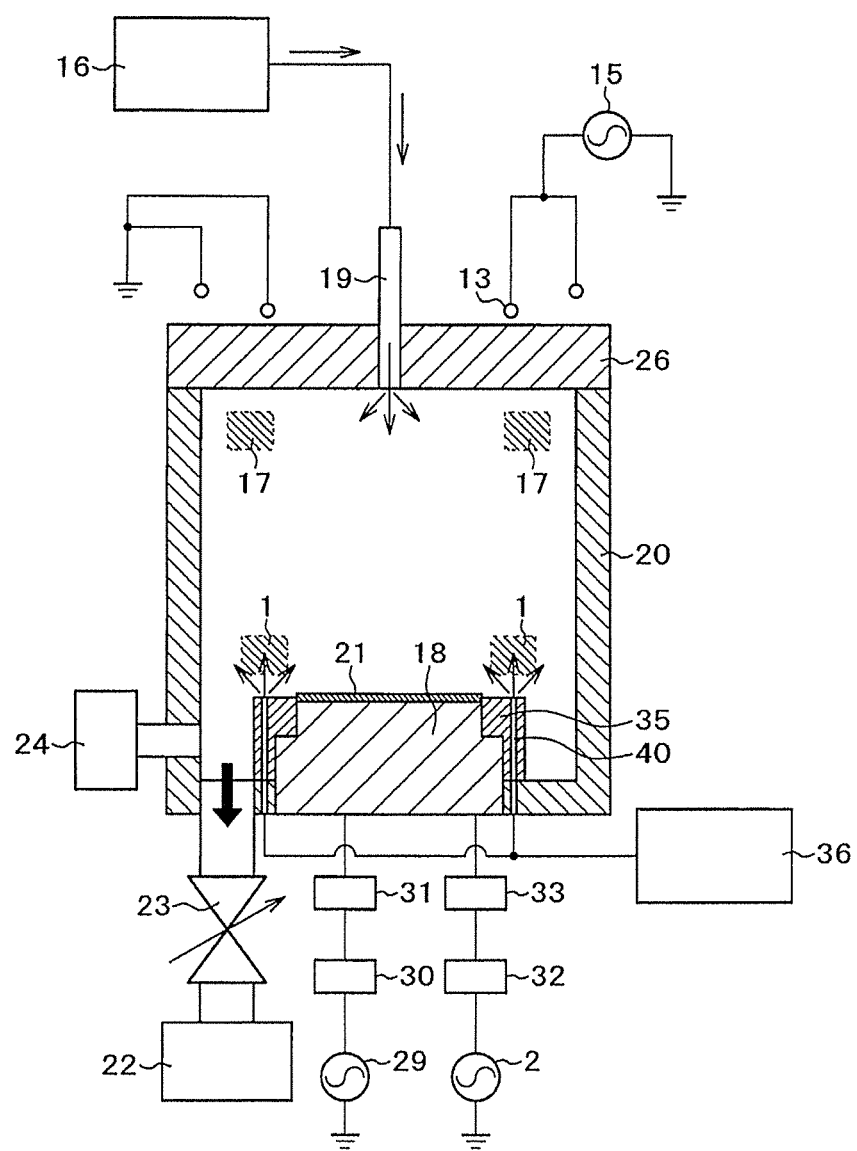
FIG. 1 is a diagram illustrating an overall rough configuration of an inductively-coupled plasma etching apparatus according to a first embodiment of the present invention.

A first embodiment of the present invention will be described with reference to FIGS. 1 to 5E. FIG. 1 is a diagram illustrating an overall rough configuration of an inductively-coupled plasma etching apparatus which is one of electrodeless discharge systems. The same reference numerals or symbols denote identical constituent elements. In the plasma etching apparatus, an etching gas is supplied from a gas supply mechanism 16 to a decompression chamber 20 through a gas introduction mechanism 19. Also, an exhaust velocity in the decompression chamber 20 is adjusted by a turbo-molecular pump 22 and an adjustable pressure control valve 23 so that a pressure of the etching gas within the decompression chamber 20, which is monitored by a manometer 24, can be set to a desired value. Also, when a RF power of, for example, 13.56 MHz is supplied to an antenna coil 13 located outside of a dielectric window 26 made of alumina from a RF power supply 15, a ring-shaped plasma generation area 17 is formed on the decompression chamber side of the dielectric window 26 under the antennal coil 13. Ions and radicals are generated from the etching gas by the plasma generation area 17, and the ions and the radicals are transported by diffusion so as to be irradiated on a sample 21 located on a stage 18. Also, a RF power supply 29 of 400 kHz for bias supply is fitted to the stage 18 through a matching box 30 and a low-pass filter 31. A RF voltage is applied from the RF power supply 29 to the stage 18 to allow the sample 21 to generate a negative voltage so that positive ions within the decompression chamber 20 can be accelerated and irradiated. Aside from this configuration, a RF power supply 2 of 40 MHz for plasma generation is connected to the stage 18 through a matching box 32 and a high-pass filter 33, and the RF power is input to the stage 18 from the RF power supply 2 so that a ring-shaped plasma generation area 1 can be formed in the outer periphery of the sample 21. The two RF power supplies 2 and 29 different in frequency are thus fitted to the stage 18 so that a negative voltage for accelerating positive ions and the plasma generation can be controlled, independently.

Figure 2A:
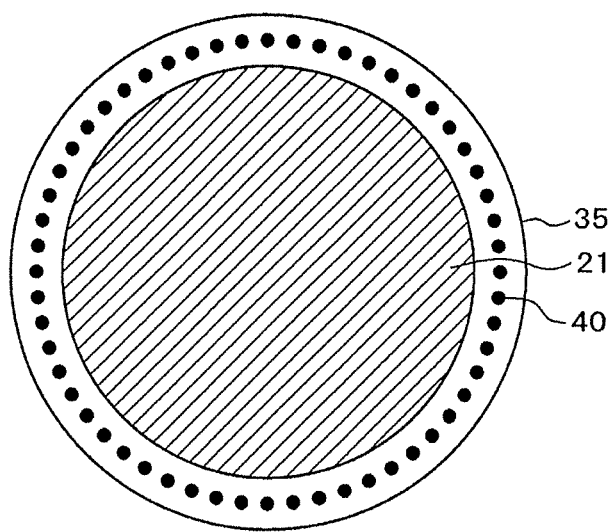
FIG. 2A is a top view illustrating a stage of the inductively-coupled plasma etching apparatus illustrated in FIG. 1.

Also, an insulating ring 35 made of dielectric material is placed on the outer periphery of the stage 18. As illustrated in FIG. 2A, 56 gas introduction holes 40 for supplying an additive gas are concentrically arranged in the insulating ring 35 at regular intervals, and the additive gas supplied from a gas supply mechanism 36 can be introduced to the outer periphery. With the use of this apparatus, the sample in which an oxide mask having a line pattern 100 nm in thickness and 50 nm in width is formed on a silicon substrate of φ300 mm is etched. It is desirable that the gas introduction holes are positioned within ⅕ of a sample diameter from the outermost periphery of the sample.

Figure 3A:
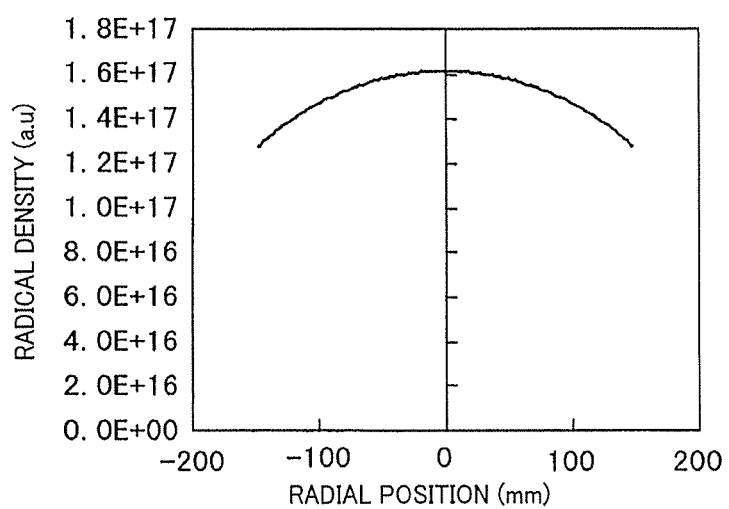
FIG. 3A is a graph illustrating an oxygen radical concentration distribution in the vicinity of a sample surface (a case where there is no additive gas in the vicinity of the sample and no RF voltage is applied in the vicinity of the sample)
Figure 3B:
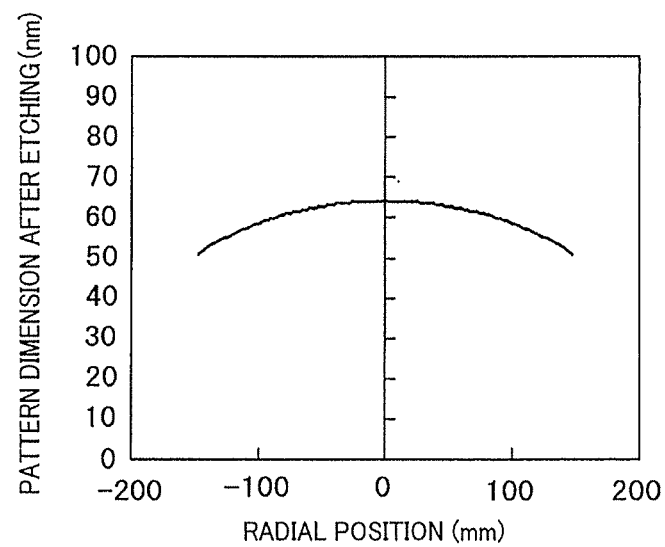
FIG. 3B is a graph illustrating the radial distribution of a line pattern dimension after a silicon substrate has been etched in the oxygen radical concentration distribution illustrated in FIG. 3A.

First, as the etching gas, a mixed gas of chlorine, hydrogen bromide, and oxygen is introduced from the gas introduction mechanism 19, no additive gas is supplied from the gas introduction holes 40, no RF voltage is applied from the RF power supply 2 for plasma generation, and the RF voltage is applied from the RF power supply 29 for bias to etch the silicon substrate. An oxygen radical concentration distribution in the vicinity of the sample surface in this situation is illustrated in FIG. 3A. It is found from FIG. 3A that an oxygen radical concentration is high in the center of the sample 21, and low in the outer periphery thereof. The radial distribution of the dimension of the pattern of the sample after processing in this situation is illustrated in FIG. 3B. It is found from FIG. 3B that the pattern dimension is large in the center of the silicon substrate and small in the outer periphery of the sample as with the oxygen radical concentration distribution. Accordingly, it is found that this is because the density of the oxygen radical is low in the outer periphery of the sample 21.

Figure 4A:
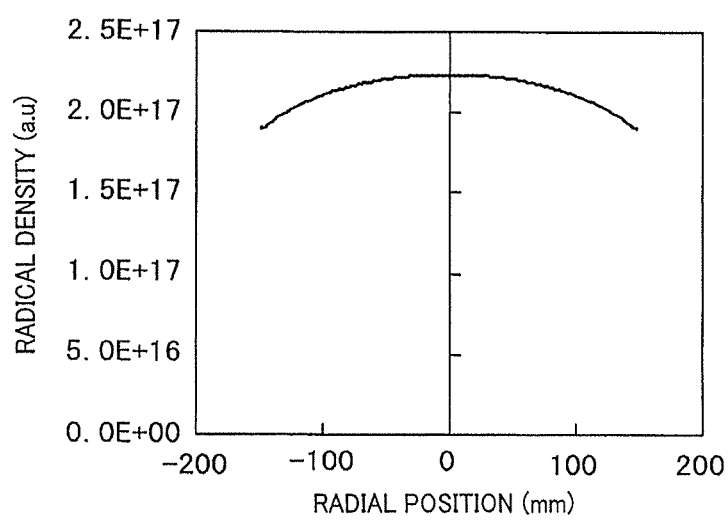
FIG. 4A is a graph illustrating an oxygen radical concentration distribution in the vicinity of the sample surface (a case where there is the additive gas in the vicinity of the sample and no RF voltage is applied in the vicinity of the sample)
Figure 4B:
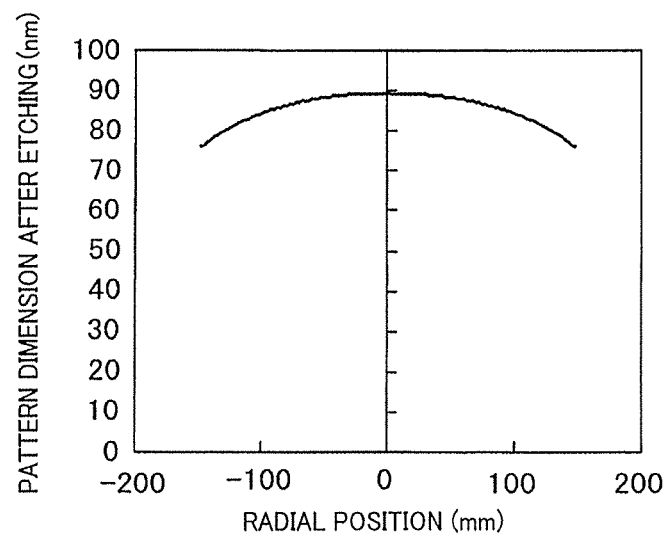
FIG. 4B is a graph illustrating the radial distribution of the line pattern dimension after the silicon substrate has been etched in the oxygen radical concentration distribution illustrated in FIG. 4A.

Under the circumstances, in order to increase the oxygen radical density in the sample outer periphery, an oxygen gas of 10 sccm is added from the gas introduction holes 40 to execute etching. The oxygen radical concentration distribution in the vicinity of the sample surface is illustrated in FIG. 4A. The oxygen radical concentration is increased in whole, but there is no change in a status where the oxygen radical concentration is high in the center of the sample, and low in the outer periphery. The radial distribution of the dimension of the pattern of the sample after processing in this situation is illustrated in FIG. 4B. The pattern dimension is larger in whole, but there is no change in a status where the pattern dimension is large in the center of the sample 21, and small in the outer periphery of the sample 21.

Figure 5A:
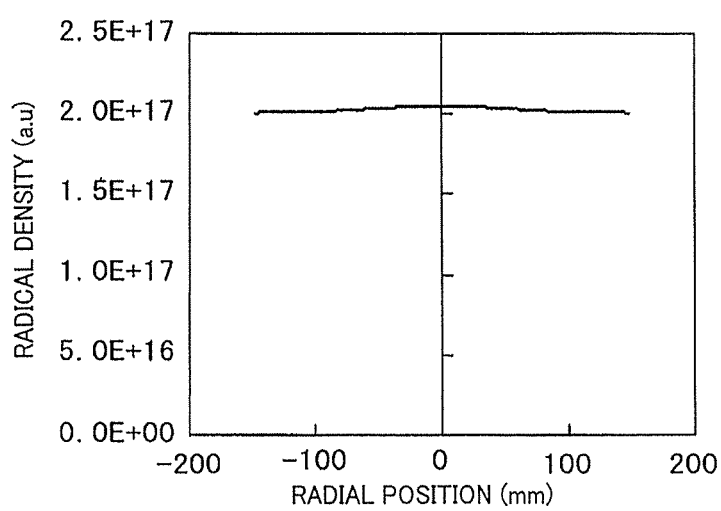
FIG. 5A is a graph illustrating an oxygen radical concentration distribution in the vicinity of the sample surface (a case where there is the additive gas in the vicinity of the sample and the RF voltage is applied in the vicinity of the sample)
Figure 5B:
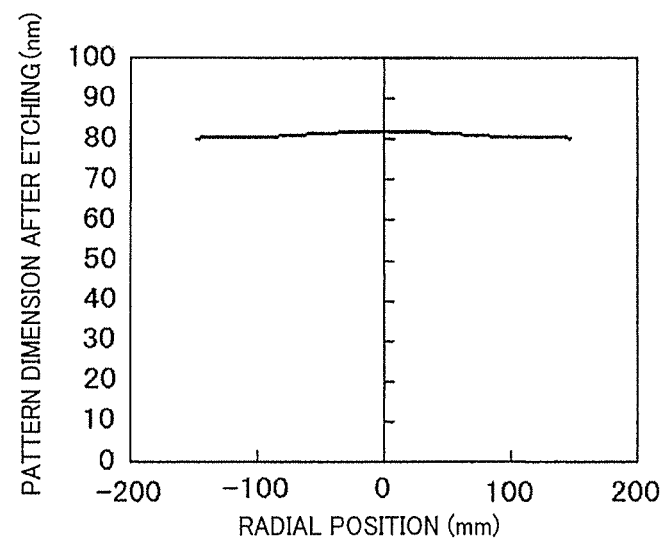
FIG. 5B is a graph illustrating the radial distribution of the line pattern dimension after the silicon substrate has been etched in the oxygen radical concentration distribution illustrated in FIG. 5A.

Under the circumstances, the RF power of 100 W is input from the RF power supply 2 for plasma generation to execute etching. The oxygen radical concentration distribution in the vicinity of the sample surface in this situation is illustrated in FIG. 5A. It is found from FIG. 5A that the oxygen radical concentration in the center of a wafer (sample) is decreased, and the oxygen radical concentration in the outer periphery is increased so that the oxygen radical concentration becomes uniform. The radial distribution of the dimension of the pattern of the sample after processing in this situation is illustrated in FIG. 5B. The dimension of the pattern in the outer periphery of the sample is increased, and the pattern dimension becomes substantially uniform within the sample plane.

Figure 2B:
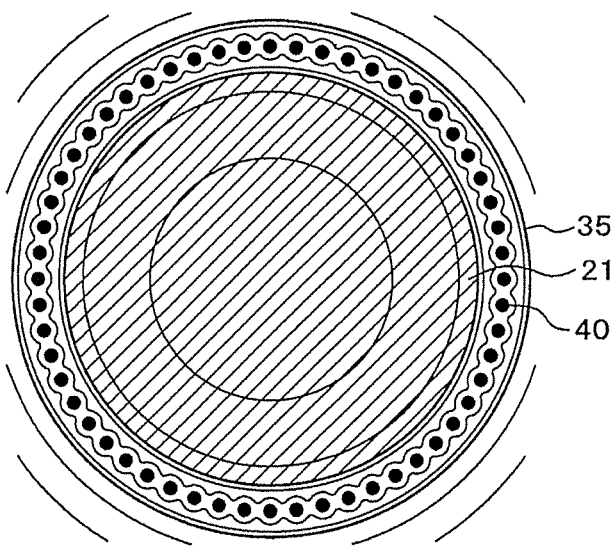
FIG. 2B is a diagram illustrating a contour of a radical distribution in the vicinity of the stage of the inductively-coupled plasma etching apparatus illustrated in FIG. 1 (a case where gas introduction hole intervals are small)
Figure 2C:
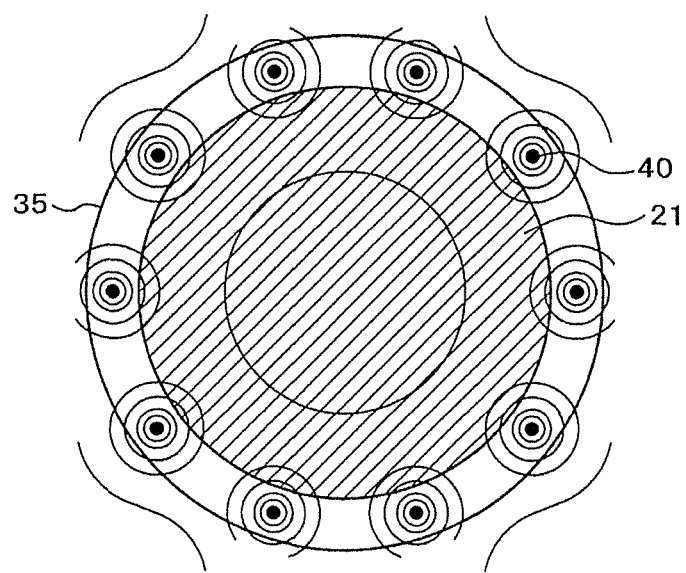
FIG. 2C is a diagram illustrating a contour of a radical distribution in the vicinity of the stage of the inductively-coupled plasma etching apparatus illustrated in FIG. 1 (a case where the gas introduction hole intervals are large)
Figure 2D:
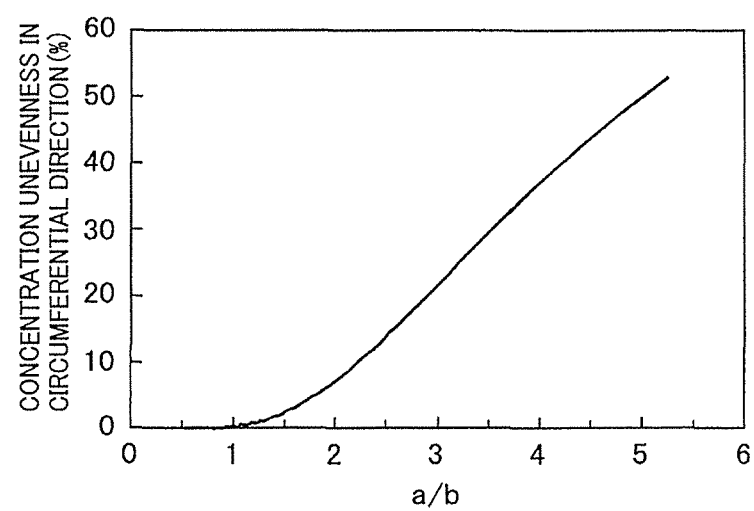
FIG. 2D is a graph illustrating a relationship between a radical concentration unevenness in a circumferential direction and a (pitches of gas introduction holes)/b (distance between sample and gas introduction holes) in the stage of the inductively-coupled plasma etching apparatus illustrated in FIG. 1.
Figure 2E:
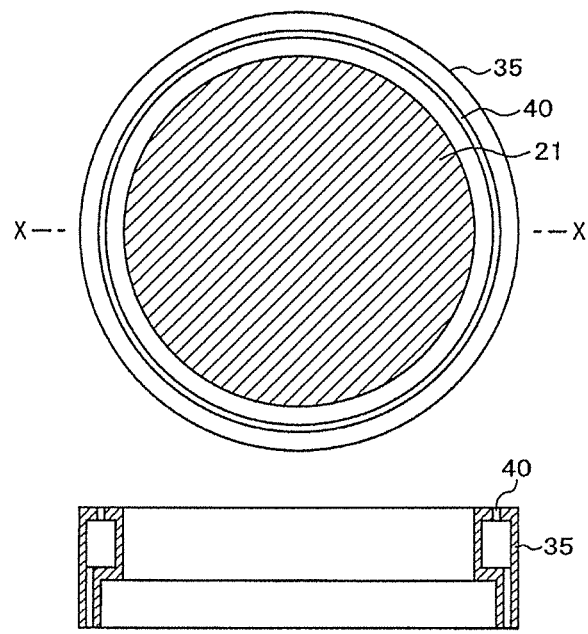
FIG. 2E is a diagram illustrating another stage of the inductively-coupled plasma etching apparatus illustrated in FIG. 1, in which an upper portion is a top view, and a lower portion is a cross-sectional view taken along a line X-X.

Subsequently, an influence of the pitches of the gas introduction holes 40 has been studied. FIGS. 2B and 2C illustrate the radical distributions by contours when the number of gas introduction holes 40 is 56 and 10, respectively. In any cases, the radical density is higher in the vicinity of the holes, and lower with distance from the holes. In the case of FIG. 2B, because the number of holes is large, the concentric radical distribution can be realized within the wafer plane. On the other hand, in the case of FIG. 2C, because the number of holes is small, the radical distribution is not concentric even within the wafer plane, and portions higher in the concentration and portions lower in the concentration are found in the circumferential direction. The radical concentration unevenness in the circumferential direction has a very close correlation with a rate a/b between a pitch a of the holes and a distance b between the holes and the wafer (outermost periphery). The results of examining this relationship are illustrated in FIG. 2D. It is found from FIG. 2D that the radical concentration unevenness is reduced more as a/b is smaller, and the concentration unevenness is substantially eliminated when a/b is 1 or lower. That is, it is desirable that the pitch a of the gas introduction holes 40 is shorter than the distance b between the holes and the wafer. Also, if a structure in which the pitch a of the holes is shortened to the extreme, that is, a slit-like gas introduction mechanism is provided as illustrated in FIG. 2E, it is conceivable that the uniform gas supply can be conducted.

Figure 5C:
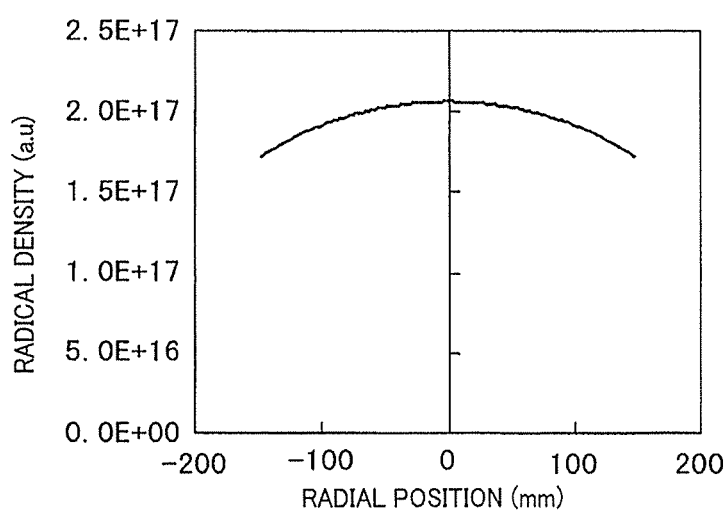
FIG. 5C is a graph illustrating an oxygen radical concentration distribution in the vicinity of the sample surface (a case where there is the additive gas in the vicinity of the dielectric window and the RF voltage is applied in the vicinity of the sample)
Figure 5D:
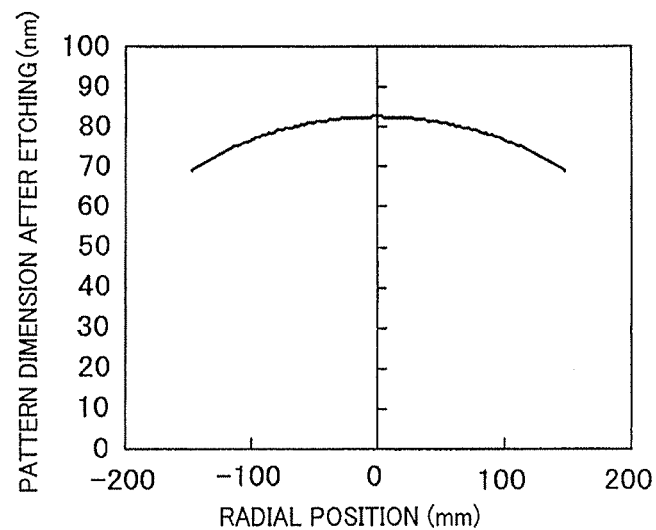
FIG. 5D is a graph illustrating the radial distribution of the line pattern dimension after the silicon substrate has been etched in the oxygen radical concentration distribution illustrated in FIG. 5C.
Figure 5E:
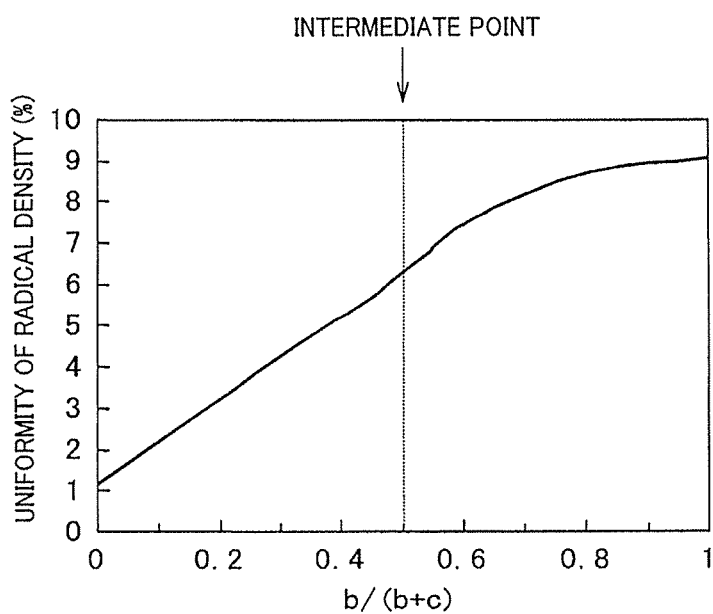
FIG. 5E is a graph illustrating a relationship between the uniformity of the radical density in the vicinity of the sample surface, and b (distance between gas introduction holes and sample)/{b+c (distance between gas introduction holes and dielectric window)}.

Subsequently, an influence of the position of the gas introduction holes 40 has been studied. In the above-mentioned configuration, the gas introduction holes 40 are formed in the outermost periphery of the dielectric window 26, and the results of examining the radical concentration distribution in the vicinity of the wafer as in FIG. 5A are illustrated in FIG. 5C. The radical concentration is increased in whole, but the status in which the radical concentration is low remains as it is. The radial distribution of the dimension of the pattern of the sample after processing is illustrated in FIG. 5D. The pattern dimension becomes larger in whole, but there is no change in the status in which the pattern dimension is large in the center of the sample and small in the outer periphery of the sample. That is, it is found that no positive effect is obtained if the gas introduction holes 40 are distant from the sample even if the gas introduction holes 40 are formed in the outer periphery of the sample. Whether the positive effect of the gas addition is obtained or not depends on distance b between the gas introduction holes 40 and the wafer and a distance c between the gas introduction holes 40 and the dielectric window 26. A relationship between the uniformity of the radical concentration distribution in the vicinity of the wafer and b/(b+c) is illustrated in FIG. 5E. In a range where b/(b+c) is smaller than 0.5, it is found that the uniformity of the radical concentration distribution is improved in proportion to b/(b+c). That is, it is found that in order to obtain the positive effect of the radical distribution uniformity, there is a requirement that the gas introduction holes 40 are closer to the wafer than the dielectric window 26.

In this embodiment, the frequency of the RF power supply 2 for plasma generation is set to 40 MHz. However, if the RF power supply is 4 MHz or higher, the same effect is obtained even if the RF power supply 2 is set to any frequency. Also, in this embodiment, the frequency of the RF power supply 29 for bias application is set to 400 kHz. However, if the frequency is 100 kHz or higher and lower than the frequency of the RF power supply 2 for plasma generation, the same effect is obtained even if the RF power supply 29 is set to any frequency. Also, in this embodiment, the gas introduction holes 40 for additive gas are formed in the insulating ring 35 placed on the outer periphery of the stage 18. However, the same effect is obtained if the gas introduction holes 40 are formed in the outer periphery of the sample 21 and at a position closer to the sample 21 than the dielectric window 26. If the pitch of the gas introduction holes 40 is shorter than the distance between the gas introduction holes 40 and the sample 21, the same effect is obtained. Also, in this embodiment, the plasma etching apparatus of the inductively-coupled plasma system is used. However, the same effect is obtained if the plasma etching apparatus is of the electrodeless discharge system. In this embodiment, oxygen is used as the additive gas. However, the same effect is obtained even by other additive gases if the etching gas or the sample structure is different.

As described above, according to this embodiment, there can be provided the plasma etching method using the electrodeless system which generates the radicals in the outer periphery of the sample to uniformize the radical density so as to improve the uniformity of etching. Also, because both of the RF voltage for bias application and the RF voltage for plasma generation are applied to the stage, the structure is simple, and an increase in the costs can be suppressed.

Second Embodiment

Figure 6:
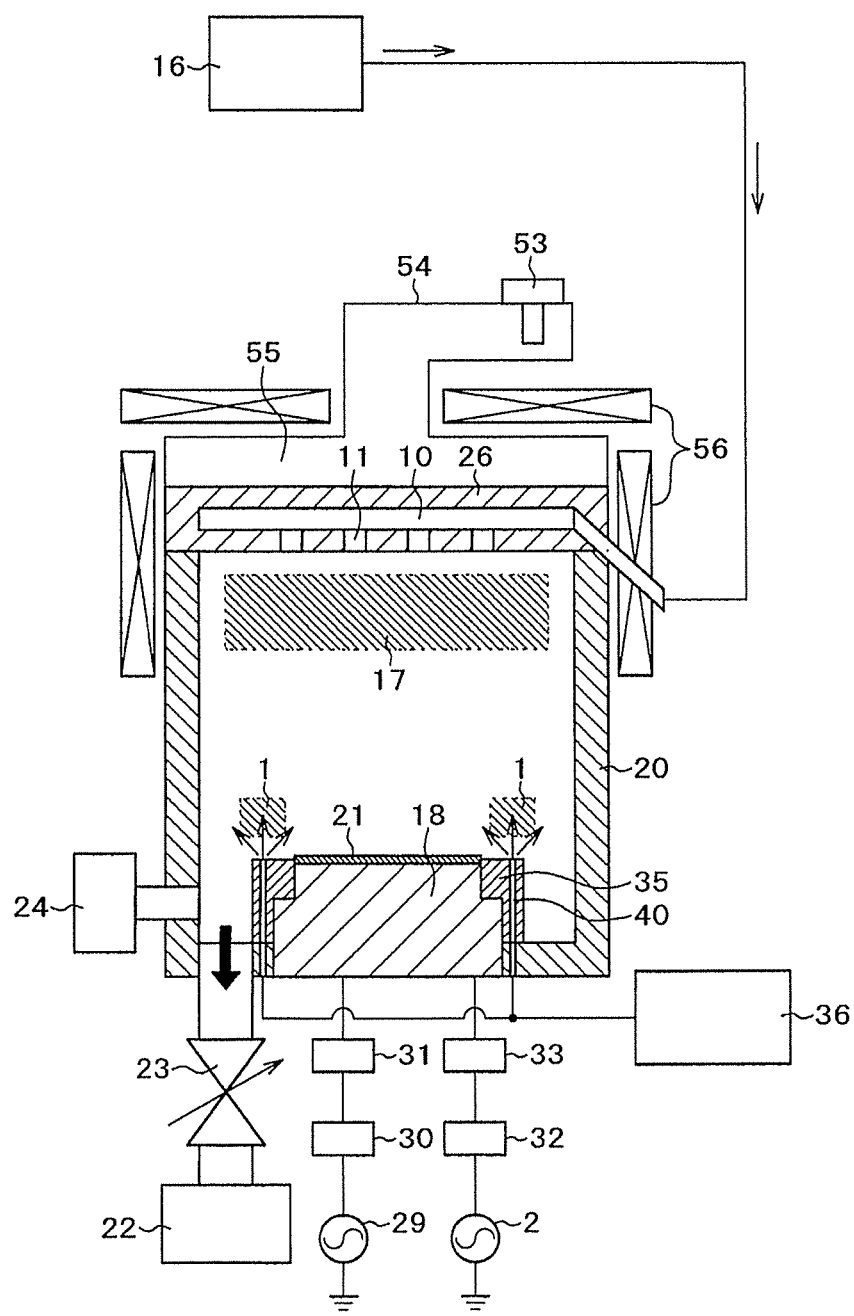
FIG. 6 is a diagram illustrating an overall rough configuration of a magneto-microwave plasma etching apparatus according to a second embodiment of the present invention.

A second embodiment of the present invention will be described with reference to FIGS. 6 to 9B. The configurations described in the first embodiment but not described in this embodiment can be applied to this embodiment unless the circumstances are exceptional. FIG. 6 is a diagram illustrating an overall rough configuration of a magneto-microwave plasma etching apparatus according to this embodiment. In this plasma etching apparatus, an etching gas goes through a gas reservoir 10 formed within the dielectric window 26 made of quartz from the gas supply mechanism 16, and is then introduced into the decompression chamber 20 from a plurality of holes 11 (shower plate structure) formed on the decompression chamber of the dielectric window 26. Also, the exhaust velocity in the decompression chamber 20 is adjusted by the turbo-molecular pump 22 and the adjustable pressure control valve 23 so that a pressure of the etching gas within the decompression chamber 20 can be set to a desired value. Also, microwaves generated by magnetrons 53 are supplied into the decompression chamber 20 through a waveguide 54, a cavity resonance part 55, and the dielectric window 26. The plasma generation area 17 can be formed in an upper part of the decompression chamber 20 by mutual interaction of a lateral electric field produced by the microwaves and a longitudinal magnetostatic field produced by the coils 56.

Ions and radicals are generated from the etching gas by the plasma generation area 17, and the ions and the radicals are transported by diffusion, and can be irradiated on the sample 21 placed on the stage 18. Also, the RF power supply 29 of 400 kHz for bias supply is fitted to the stage 18 through the matching box 30 and the low-pass filter 31. A RF voltage is applied from the RF power supply 29 to the stage 18 to allow the sample 21 to generate a negative voltage so that positive ions within the decompression chamber 20 can be accelerated and irradiated. Aside from this configuration, the RF power supply 2 of 27 MHz for plasma generation is connected to the stage 18 through the matching box 32 and the high-pass filter 33, and the RF power is input to the stage 18 from the RF power supply 2 so that a ring-shaped plasma generation area 1 can be formed in the outer periphery of the sample 21. In particular, in the apparatus having the longitudinal magnetostatic field within the decompression chamber as in the magneto-microwave plasma etching apparatus, plasma can be efficiently generated in only the outer periphery of the sample 21, by mutual interaction of a lateral electric field produced in the outer periphery of the sample 21 by the electric power supplied from the RF power supply 2 for the plasma generation, and a longitudinal magnetostatic field produced by coils 56. The two RF power supplies 2 and 29 different in frequency are thus fitted to the stage 18 so that a negative voltage for accelerating positive ions and the plasma generation can be controlled, independently.

Also, the insulating ring 35 made of dielectric material is placed on the outer periphery of the stage 18. As illustrated in FIG. 2A, the gas introduction holes 40 for supplying an additive gas are concentrically arranged in the insulating ring 35, and the additive gas supplied from the gas supply mechanism 36 can be introduced to the outer periphery of the sample 21.

With the use of this apparatus, a sample in which an Si3N4 film 300 nm in thickness is deposited on a silicon wafer of φ300 mm, and a mask made of an organic material having a line pattern 200 nm in thickness and 50 nm in width is formed on that film is etched.

Figure 7A:
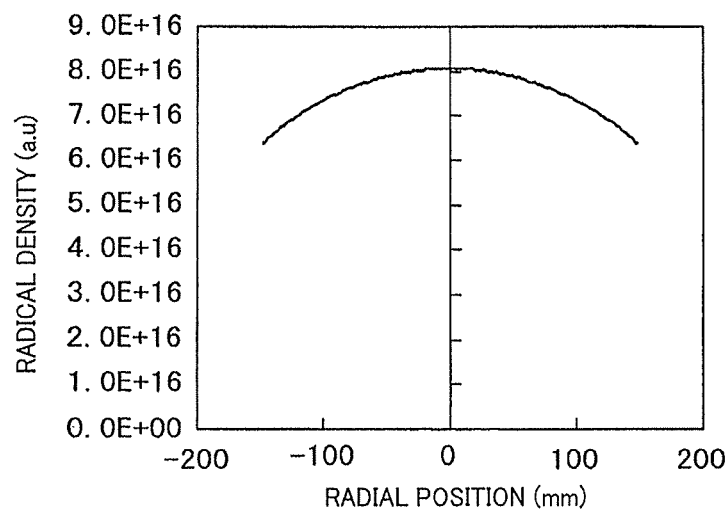
FIG. 7A is a graph illustrating a CxFy radical concentration distribution in the vicinity of the sample surface (a case where there is no additive gas in the vicinity of the sample and no RF voltage is applied in the vicinity of the sample)
Figure 7B:
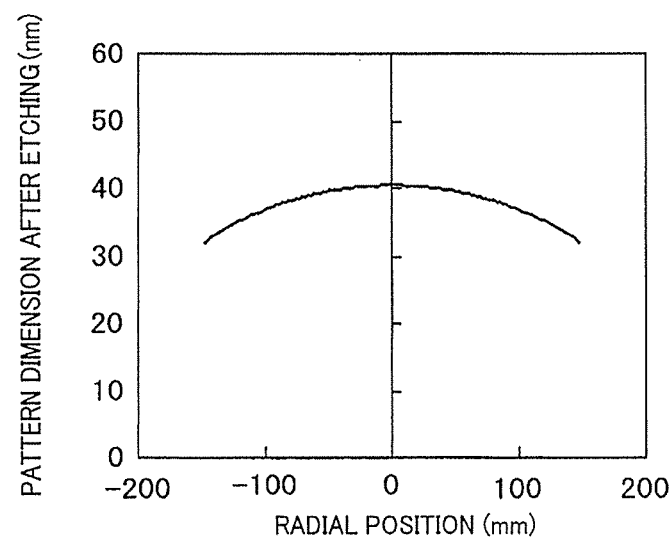
FIG. 7B is a graph illustrating the radial distribution of a line pattern dimension after an Si3N4 film has been etched in the CxFy radical concentration distribution illustrated in FIG. 7A.

First, as the etching gas, a mixed gas of CHF3 and Ar is introduced from the gas supply mechanism 16, no additive gas is supplied from the gas introduction holes 40, no RF voltage is applied from the RF power supply 2 for plasma generation, and the RF voltage is applied only from the RF power supply 29 of 400 kHz for bias to etch the silicon substrate. A CxFy radical concentration distribution in the vicinity of the sample surface in this situation is illustrated in FIG. 7A. It is found from FIG. 7A that the oxygen radical concentration is high in the center of the sample 21, and low in the outer periphery thereof. The radial distribution of the dimension of the pattern of the sample 21 after processing in this situation is illustrated in FIG. 7B. It is found from FIG. 7B that the pattern dimension is large in the center of the sample 21 and small in the outer periphery of the sample 21 as with the CxFy radical concentration distribution. That is, it is found that this is because the density of the CxFy radical is low in the outer periphery of the sample 21.

Figure 8A:
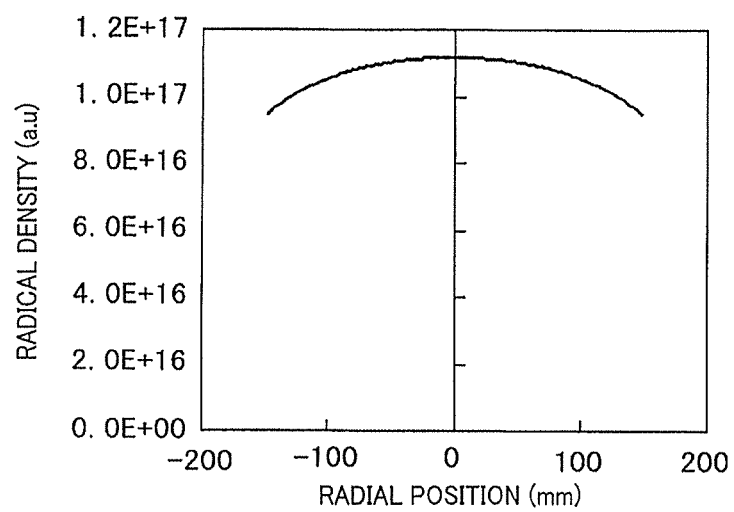
FIG. 8A is a graph illustrating the CxFy radical concentration distribution in the vicinity of the sample surface (a case where there is the additive gas in the vicinity of the sample and no RF voltage is applied in the vicinity of the sample)
Figure 8B:
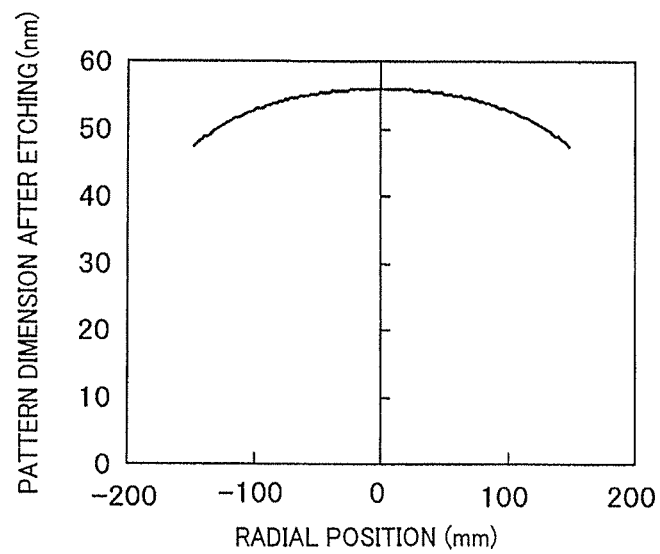
FIG. 8B is a graph illustrating the radial distribution of the line pattern dimension after the Si3N4 film has been etched in the CxFy radical concentration distribution illustrated in FIG. 8A.

Under the circumstances, in order to increase the CxFy radical density in the sample outer periphery, CH2F2 of 10 sccm is added from the gas introduction holes 40 for additive gas introduction to execute etching. The radical concentration distribution in the vicinity of the sample surface is illustrated in FIG. 8A. The CxFy radical concentration is increased in whole, but there is no change in a status where the radical concentration is high in the center of the sample 21, and low in the outer periphery thereof. The radial distribution of the dimension of the pattern of the sample after processing in this situation is illustrated in FIG. 8B.

The pattern dimension is larger in whole, but there is no change in a status where the pattern dimension is large in the center of the sample 21, and small in the outer periphery of the sample 21.

Under the circumstances, the RF power of 50 W is input from the RF power supply 2 for plasma generation to execute etching. The dimension of the pattern in the outer periphery of the sample 21 is increased, and the pattern dimension becomes substantially uniform within the sample plane.

Figure 9A:
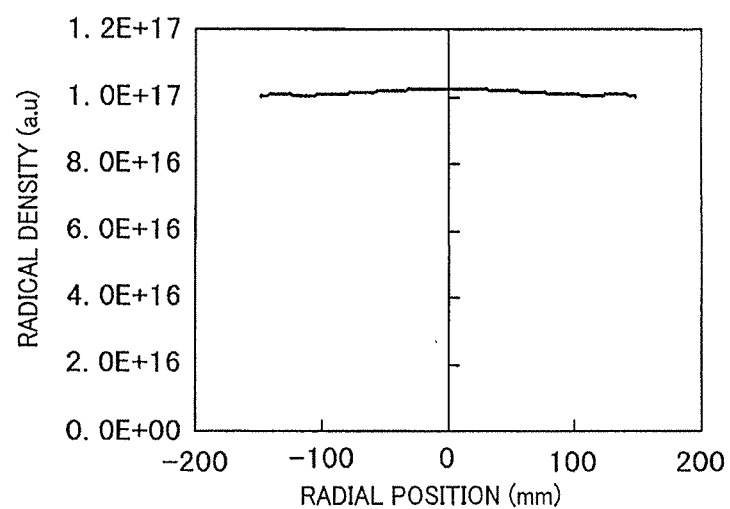
FIG. 9A is a graph illustrating the CxFy radical concentration distribution in the vicinity of the sample surface (a case where there is the additive gas in the vicinity of the sample and the RF voltage is applied in the vicinity of the sample)
Figure 9B:
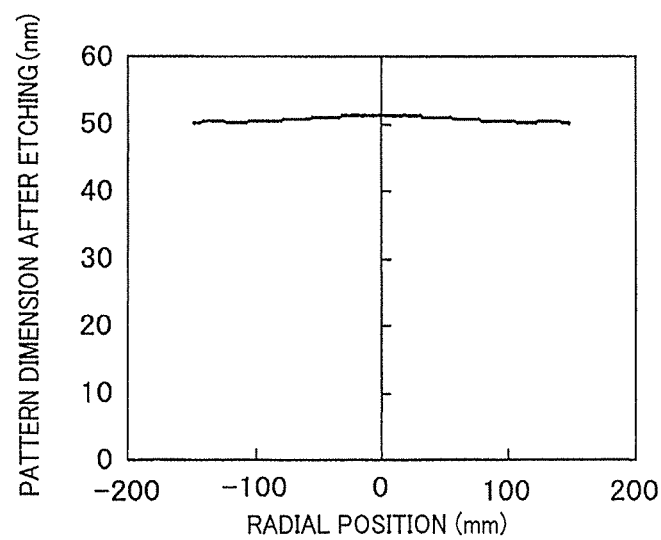
FIG. 9B is a graph illustrating the radial distribution of the line pattern dimension after the Si3N4 film has been etched in the CxFy radical concentration distribution illustrated in FIG. 9A.

Under the circumstances, the RF power of 100 W is input from the RF power supply 2 for plasma generation to execute etching. The CxFy radical concentration distribution in the vicinity of the sample surface in this situation is illustrated in FIG. 9A. It is found from FIG. 9A that the radical concentration in the center of a wafer (sample) is decreased, and the radical concentration in the outer periphery is increased so that the radical concentration becomes uniform. The radial distribution of the dimension of the pattern of the sample after processing in this situation is illustrated in FIG. 9B. The dimension of the pattern in the outer periphery of the sample is increased, and the pattern dimension becomes substantially uniform within the sample plane.

In this embodiment, the frequency of the RF power supply 2 for plasma generation is set to 27 MHz. However, if the RF power supply is 4 MHz or higher, the same effect is obtained even if the RF power supply 2 is set to any frequency. Also, in this embodiment, the frequency of the RF power supply 29 for bias application is set to 400 kHz. However, if the frequency is 100 kHz or higher and lower than the frequency of the RF power supply 2 for plasma generation, the same effect is obtained even if the RF power supply 29 is set to any frequency. Also, in this embodiment, the gas introduction holes 40 for additive gas are formed in the insulating ring 35 placed on the outer periphery of the stage 18. However, the same effect is obtained if the gas introduction holes 40 are formed in the outer periphery of the sample 21 and at a position closer to the sample 21 than the dielectric window 26. Also, in this embodiment, the plasma etching apparatus of the magneto-microwave plasma system is used. However, the same effect is obtained if the plasma etching apparatus is of the electrodeless discharge system. In this embodiment, CH2F2 is used as the additive gas. However, the same effect is obtained if the additive gas is fluorocarbon gas. Also, the same effect is obtained even by other additive gases if the etching gas or the sample structure is different.

As described above, according to this embodiment, there can be provided the plasma etching method using the electrodeless system which generates the radicals in the outer periphery of the sample to uniformize the radical density so as to improve the uniformity of etching. Also, because both of the RF voltage for bias application and the RF voltage for plasma generation are applied to the stage, the structure is simple, and an increase in the costs can be suppressed.

Third Embodiment

Figure 10:
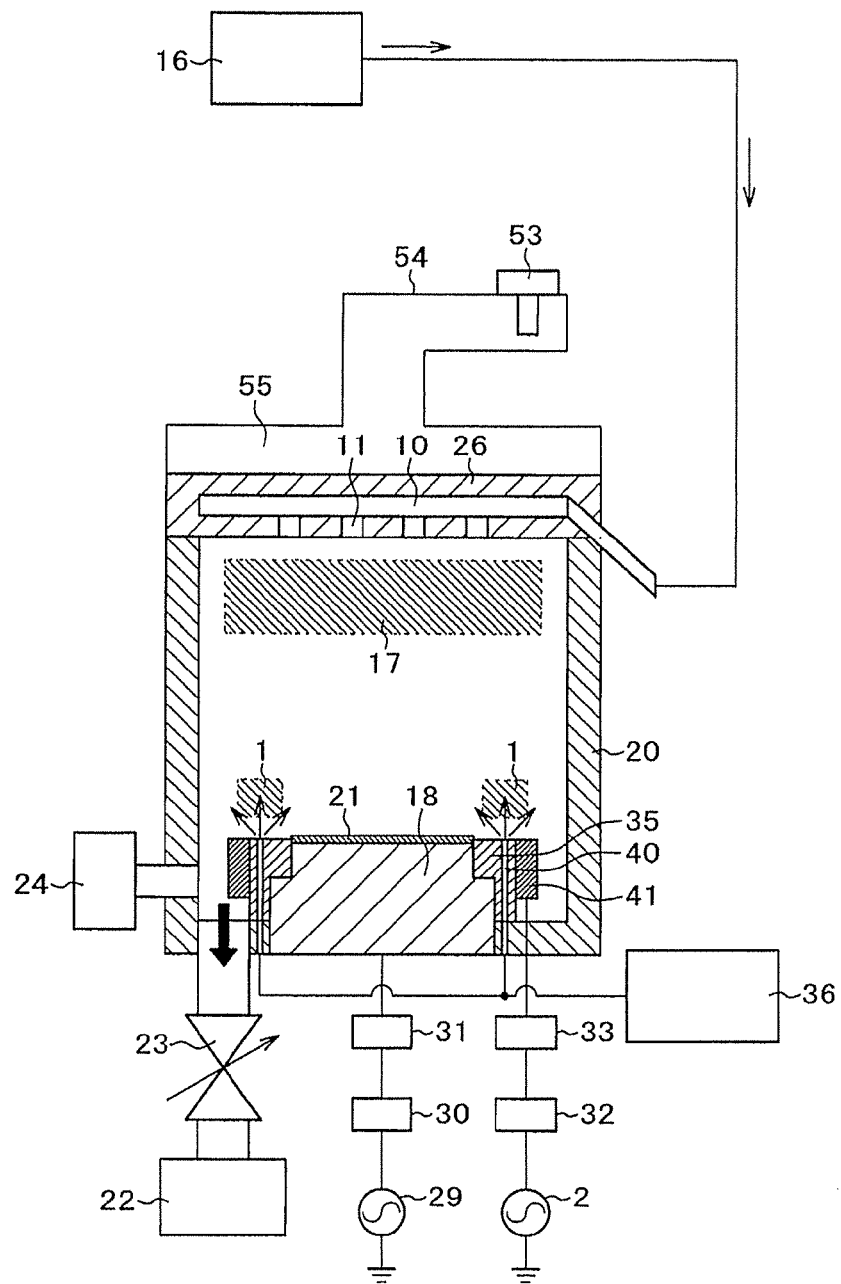
FIG. 10 is a diagram illustrating an overall rough configuration of a microwave etching apparatus according to a third embodiment of the present invention.

A third embodiment of the present invention will be described with reference to FIGS. 10 to 13. The configurations described in the first or second embodiment but not described in this embodiment can be applied to this embodiment unless the circumstances are exceptional. FIG. 10 is a diagram illustrating an overall rough configuration of a microwave plasma etching apparatus according to this embodiment. In this plasma etching apparatus, an etching gas goes through the gas reservoir 10 formed within the dielectric window 26 made of quartz from the gas supply mechanism 16, and is then introduced into the decompression chamber 20 from the plurality of holes 11 (shower plate structure) formed on the decompression chamber 20 of the dielectric window 26. Also, the exhaust velocity in the decompression chamber 20 is adjusted by the turbo-molecular pump 22 and the adjustable pressure control valve 23 so that a pressure of the etching gas within the decompression chamber 20 can be set to a desired value. Also, microwaves generated by magnetrons 53 are supplied into the decompression chamber 20 through the waveguide 54, the cavity resonance part 55, and the dielectric window 26. The plasma generation area 17 can be formed in the vicinity of the dielectric window 26 by mutual interaction of a lateral electric field produced by the electric power of the input microwaves.

Ions and radicals are generated from the etching gas by the plasma generation area 17, and the ions and the radicals are transported by diffusion, and can be irradiated on the sample 21 placed on the stage 18. Also, the RF power supply 29 of 400 kHz for bias supply is fitted to the stage 18 through the matching box 30 and the low-pass filter 31. A RF voltage is applied from the RF power supply 29 to the stage 18 to allow the sample 21 to generate a negative voltage so that positive ions within the decompression chamber 20 can be accelerated and irradiated.

Also, the insulating ring 35 made of dielectric material is placed on the outer periphery of the stage 18. As in the figure of the first embodiment, the gas introduction holes 40 for supplying an additive gas are concentrically arranged in the insulating ring 35 as illustrated in FIG. 2A, and the additive gas supplied from the gas supply mechanism 36 can be introduced to the outer periphery of the sample 21.

An electrode 41 insulated from the stage 18 is mounted on the insulating ring outside of the gas introduction holes 40. The RF power supply 2 of 27 MHz for plasma generation is connected to the stage 18 through the matching box 32 and the high-pass filter 33, and the RF power is input to the electrode 41 from the RF power supply 2 so that the plasma generation area 1 can be formed in the outer periphery of the sample 21. The two RF power supplies 2 and 29 different in frequency are thus fitted to the stage 18 and the insulated electrode 41 so that the negative voltage for accelerating the positive ions and the plasma generation can be controlled, independently.

With the use of this apparatus, a sample in which an organic film 300 nm in thickness is deposited on a silicon wafer of φ300 mm, and a mask made of SiO2 having a line pattern 20 nm in thickness and 50 nm in width is formed on the organic film is etched.

Figure 11:
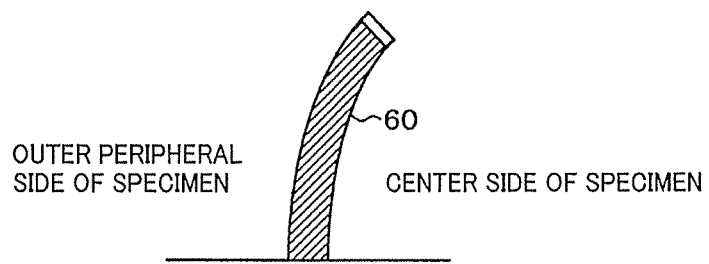
FIG. 11 is a cross-sectional view illustrating a processed shape of an organic film in an outer periphery of the sample (a case where there is no additive gas in the vicinity of the sample and no RF voltage is applied in the vicinity of the sample)

First, as the etching gas, a mixed gas of O2 and Ar is used, no additive gas is supplied, no RF voltage of 27 MHz for plasma generation is applied, and the RF voltage of 400 kHz for bias is applied to execute etching. The processing shape of the organic film in the outer periphery of the sample 21 after processing is illustrated in FIG. 11. It is found from FIG. 11 that a pattern 60 of the organic film is inclined toward the center of the sample 21. It is known that the pattern 60 of the organic film is liable to be inclined when the oxygen radical density distribution becomes non-uniform. As a result of study, it is confirmed that the oxygen radical density in the outer periphery of the sample 21 is lower than that in the center of the sample 21, and the oxygen radical density distribution becomes non-uniform.

Figure 12:
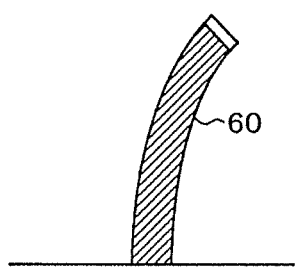
FIG. 12 is a cross-sectional view illustrating the processed shape of the organic film in the outer periphery of the sample (a case where there is the additive gas in the vicinity of the sample and no RF voltage is applied in the vicinity of the sample)

Under the circumstances, in order to increase the oxygen radical density in the outer periphery of the sample 21, oxygen of 10 sccm is added from the gas introduction holes 40 for additive gas introduction to execute etching. The processing shape of the organic film in the outer periphery of the sample 21 after processing is illustrated in FIG. 12. It is found from FIG. 12 that the pattern 60 of the organic film is inclined toward the center of the sample 21. As a result of study, it is found that, in this method, the oxygen radical density in the outer periphery of the sample 21 is not sufficiently increased.

Figure 13:
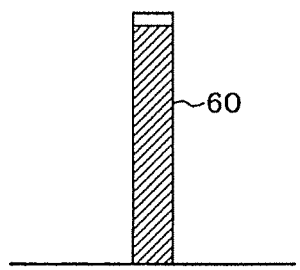
FIG. 13 is a cross-sectional view illustrating the processed shape of the organic film in the outer periphery of the sample (a case where there is the additive gas in the vicinity of the sample and the RF voltage is applied in the vicinity of the sample).

Under the circumstances, the RF power of 100 W is input from the RF power supply 2 for plasma generation to execute etching. The shape after processing in this situation is illustrated in FIG. 13. In this case, no inclination toward the center of the sample is found. Also, the dimension of the pattern in the outer periphery of the sample is increased, and the pattern dimension becomes substantially uniform within the sample plane. The cross-sectional shape after processing is identical with that even in the etching of the silicon substrate in the first embodiment and the etching of the Si3N4 film in the second embodiment.

In this embodiment, the frequency of the RF power supply 2 for plasma generation is set to 27 MHz. However, if the RF power supply is 4 MHz or higher, the same effect is obtained even if the RF power supply 2 is set to any frequency. Also, in this embodiment, the frequency of the RF power supply 29 for bias application is set to 400 kHz. However, if the frequency is 100 kHz or higher and lower than the frequency of the RF power supply 2 for plasma generation, the same effect is obtained even if the RF power supply 29 is set to any frequency. Also, in this embodiment, the gas introduction holes 40 for additive gas are formed in the insulating ring 35 placed on the outer periphery of the stage 18. However, the same effect is obtained if the gas introduction holes 40 are formed in the outer periphery of the sample 21 and at a position closer to the sample 21 than the dielectric window 26. Also, in this embodiment, the plasma etching apparatus of the microwave plasma system is used. However, the same effect is obtained if the plasma etching apparatus is of the electrodeless discharge system. In this embodiment, oxygen is used as the additive gas. However, the same effect is obtained even by other additive gases if the etching gas or the sample structure is different.

As described above, according to this embodiment, there can be provided the plasma etching method using the electrodeless system which generates the radicals in the outer periphery of the sample to uniformize the radical density so as to improve the uniformity of etching. Also, the plasma generation area formation electrode in the periphery of the sample is insulated from the stage, so that the negative voltage for accelerating the positive ions and the plasma generation can be controlled, independently.

The present invention is not limited to the above-mentioned embodiments, but includes a variety of modified examples. For example, the above-mentioned embodiments are described in detail for facilitating the understanding of the present invention, and the present invention is not always limited to the inclusion of all the above-described configurations. Also, a part of a configuration in one embodiment can be replaced with a configuration in another embodiment, and the configuration of one embodiment can be added with the configuration of another embodiment. A part of the configurations in the respective embodiments can be subjected to addition, deletion, or replacement of another configuration.

What is claimed is:

1. A plasma etching method comprising steps of:
   placing a sample on a stage disposed in a decompression chamber;
   introducing a first gas into the decompression chamber;
   supplying electric field into the decompression chamber, through a dielectric window member that is disposed above the stage and from an outside the decompression chamber, and generating plasma from the first gas in an upper portion of an inside space of the decompression chamber;
   supplying a first RF power of a first frequency to the stage, which is capable of generating a bias voltage in the sample for etching the sample with radicals which are generated in the plasma while the plasma is generated;
   introducing a second gas from a position of the stage in outer periphery of a surface of the stage, on the surface on which the sample is placed; and
   supplying a second RF power of a second frequency higher than the first frequency to the stage and generating plasma from the second gas in a lower portion of the inside space of the decompression chamber above the stage that causes radicals to be generated in the plasma generated from the second gas,
   wherein the plasma from the second gas is generated by using a lateral electric field supplied by the second RF power which is generated in a ring-shaped region at the outer periphery of the surface of the sample inside the decompression chamber.

2. The plasma etching method according to claim 1, wherein the second gas includes oxygen or fluorocarbon.

3. The plasma etching method according to claim 1, wherein the second gas is supplied from the position within ⅕ of a diameter of the sample from an outermost periphery of the sample.

4. The plasma etching method according to claim 1, wherein:
   a ring made of a dielectric material is disposed in an outer periphery of the stage, and
   the second gas is introduced via introduction holes disposed in the ring.

5. The plasma etching method according to claim 1, wherein:
   a ring made of a dielectric material is disposed in an outer periphery of the stage,
   the second gas is introduced via introduction holes disposed in the ring, and
   openings of the introduction holes are disposed at positions within ⅕ of a diameter of the sample from an outermost periphery of the sample.

6. The plasma etching method according to claim 1, wherein:
   a ring made of a dielectric material is disposed in an outer periphery of the stage,
   the second gas is introduced via introduction holes disposed in the ring, and
   openings of the introduction holes are arranged at a pitch A along the ring and at a distance B from the outermost periphery of the sample, where A/B is 1 or lower.

7. The plasma etching method according to claim 1, wherein:
   the electric field is generated by microwaves, and
   the plasma is generated by supplying both of the electric field and magnetic field within the decompression chamber.

8. The plasma etching method according to claim 1, wherein the second frequency of the second RF power is 4 MHz or higher.

9. The plasma etching method according to claim 2, wherein the second gas is supplied from the position within ⅕ of a diameter of the sample from an outermost periphery of the sample.

10. The plasma etching method according to claim 2, wherein:
- a ring made of a dielectric material is disposed in an outer periphery of the stage, and
- the second gas is introduced via introduction holes disposed in the ring.

11. The plasma etching method according to claim 2, wherein:
- a ring made of a dielectric material is disposed in an outer periphery of the stage,
- the second gas is introduced via introduction holes disposed in the ring, and
- openings of the introduction holes are disposed at positions within ⅕ of a diameter of the sample from an outermost periphery of the sample.

12. The plasma etching method according to claim 2, wherein:
- a ring made of a dielectric material is disposed in an outer periphery of the stage,
- the second gas is introduced via introduction holes disposed in the ring, and
- openings of the introduction holes are arranged at a pitch A along the ring and at a distance B from the outermost periphery of the sample, where A/B is 1 or lower.

13. The plasma etching method according to claim 2, wherein:
- the electric field is generated by microwaves, and
- the plasma is generated by supplying both of the electric field and magnetic field within the decompression chamber.

14. The plasma etching method according to claim 2, wherein the second frequency of the second RF power is 4 MHz or higher.

* * * * *